United States Patent [19]

Wong et al.

[11] Patent Number: 5,445,681
[45] Date of Patent: * Aug. 29, 1995

[54] SUPERCONDUCTOR AND PROCESS OF MANUFACTURE

[75] Inventors: James Wong, Wayland; Mark K. Rudziak, Westminister; Terence Wong, Wayland, all of Mass.

[73] Assignee: Composite Materials Technology, Inc., Shrewsbury, Mass.

[*] Notice: The portion of the term of this patent subsequent to Oct. 27, 2009 has been disclaimed.

[21] Appl. No.: 185,471

[22] Filed: Jan. 24, 1994

Related U.S. Application Data

[63] Continuation-in-part of Ser. No. 586,263, Sep. 21, 1990, abandoned, which is a continuation-in-part of Ser. No. 480,236, Feb. 15, 1990, Pat. No. 5,158,620, Ser. No. 540,193, Jun. 19, 1990, Pat. No. 5,160,794, and Ser. No. 560,163, Jul. 31, 1990, Pat. No. 5,160,550, said Ser. No. 480,236, is a continuation-in-part of Ser. No. 363,634, Jun. 8, 1989, Pat. No. 4,925,741, said Ser. No. 540,193, is a continuation-in-part of Ser. No. 480,236, Jun. 8, 1989, said Ser. No. 560,163, is a continuation-in-part of Ser. No. 480,236, Jun. 8, 1989, and Ser. No. 540,193, Jun. 8, 1989.

[51] Int. Cl.⁶ ..................... H01B 12/02; H01L 39/12; H01L 39/24
[52] U.S. Cl. ..................... 148/98; 505/918; 505/919
[58] Field of Search ............ 29/599; 148/96, 98; 428/930, 661, 660, 662, 610, 614; 505/1, 812, 813, 919, 921, 814, 918

[56] References Cited

U.S. PATENT DOCUMENTS

| | | | |
|---|---|---|---|
| 3,465,430 | 9/1969 | Barber et al. | 29/599 |
| 3,534,459 | 10/1970 | Kudo et al. | 428/646 |
| 3,625,662 | 12/1971 | Roberts et al. | 428/610 |
| 3,652,967 | 3/1972 | Tanaka et al. | 335/216 |
| 3,728,165 | 4/1973 | Howlett | 148/96 |
| 4,803,310 | 2/1989 | Zeitlin et al. | 174/125.1 |
| 4,959,279 | 9/1990 | Tanaka et al. | 428/660 |
| 5,158,620 | 10/1992 | Wong et al. | 148/96 |
| 5,160,550 | 11/1992 | Wong et al. | 148/96 |
| 5,160,794 | 11/1992 | Wong et al. | 428/661 |
| 5,174,830 | 12/1992 | Wong et al. | 148/96 |
| 5,174,831 | 12/1992 | Wong et al. | 148/98 |
| 5,223,348 | 6/1993 | Wong et al. | 428/635 |
| 5,230,748 | 7/1993 | Wong | 148/96 |

OTHER PUBLICATIONS

J. Hlasnik et al., "Properties of Superconducting NbTi Superfine filament composites with diameters $\lesssim 0.1 \mu M$", Electrotechnical Institute, Electro-Physical Research Centre, Slovak Academy of Sciences, Bratislava, Czechasovakia, Apr. 1985, Cryogenics 1985 vol. 25 Oct., 8 pages.

P. J. Lee et al., "Restricted Novel Heat Treatments for Obtaining High Jc In NbYb.5 wt.% Ti", Applied Superconductivity Center, Univ. Wisconsin (1990), 8 pages. no month.

G. L. Dorofejev et al., "Current Carrying Capacity of Superconductors with Artificial Pinning Centers", Kurchatov Institute of Atomic Energy, Moscow, USSR (1985), pp. 564–566 no month.

L. R. Motowidle, "NvTi Superconductors with Artificial Pinning Structures", IGC Advanced Superconductors, Inc., Waterbury CT, 7 pages. (no date).

Primary Examiner—John Zimmerman
Attorney, Agent, or Firm—Hayes, Soloway, Hennessey, Grossman & Hage

[57] ABSTRACT

A method for producing a superconductor by partial inter diffusion of layers of metal under a diffusion heat treatment to provide a ductile beta phase alloy, along with undiffused metal layers to permit ease of extrusion and drawing to fine layer thickness. At some point in the reduction the layers are further diffused to give an alloy superconducting product which is optimal for the high field (5–9 T) of interest in contact with a non-superconducting layer. This optimal diffusion is preferably accomplished after a sufficient reduction such that the individual metal layers are 2.5–15 microns thick.

5 Claims, 6 Drawing Sheets

SUPERCONDUCTOR AND PROCESS OF MANUFACTURE

The present application is a continuation-in-part of Ser. No. 07/586,263 filed Sep. 21, 1990 (now abandoned) which is a continuation-in-part of applications Ser. No. 480,236 filed Feb. 15, 1990, U.S. Pat. No. 5,158,620; Ser. No. 540,193 filed Jun. 19, 1990, U.S. Pat. No. 5,160,794; and Ser. No. 560,163 filed Jul. 31, 1990, U.S. Pat. No. 5,160,550. Application Ser. No. 480,236 is a continuation-in-part of application Ser. No. 363,634 filed Jun. 8, 1989, U.S. Pat. No. 4,925,741. Application Ser. No. 540,193 is a continuation-in-part of Ser. No. 480,236 and application Ser. No. 560,163 is a continuation-in-part of Ser. No. 480,236 and Ser. No. 540,193. In the parent and related patents alternate layers (for example) of Ti and Nb are reacted during the course of reduction in size to form alternate layers of alloys which are superconducting at high magnetic fields, and other metal layers which are not superconducting at the high magnetic fields in which the superconductors are employed.

The present invention relates to the production of improved superconductors.

BACKGROUND OF THE INVENTION

In the parent patent and related patents, derived from the parent applications, (for example U.S. Pat. Nos. 5,160,550, 5,160,794, 5,230,748, and 5,174,830) there is an extensive discussion of the prior art relating to NbTi, NbTiTa and other superconducting systems particularly those involving artificial pinning centers. This background is incorporated in its entirety by reference.

In the manufacture of superconducting wire for very high field magnets, such as those used in the proposed Superconducting Super Collider (SSC), or the proposed Large Hadron Collider (LHC), the superconductor must remain superconducting in very high magnetic fields in the range of 5 to 9 tesla. It is also recognized by those familiar in the art that such material must be produced from large billets, up to 300 mm in diameter, in order to achieve cost effective economies of scale. Further, as has been described in the parent applications the final reacted Nb+Ti layer thickness must be in the range of 100 nm in order to achieve optimal conductor Jc's. Thus for a given final wire design, the ratio of the final wire diameter to the optimal layer thickness (100 nm) must be the same for the ratio of the starting multifilamentary restack billet diameter (300 mm) to the initial layer thickness because the reduction in diameter is the same as the reduction in layer thickness.

For example, the conductor design for the SSC called for a final wire size of 0.648 mm in diameter. The reduction in diameter from 300 mm multifilamentary billet to 0.648 mm wire is a factor of 463 times. Thus, the initial Nb+Ti layer thickness in the multifilament billet must be 46.3 microns because the final layer thickness must be around 100 mn for optimal Jc's (463×100 nm). Such a large initial layer thickness poses special problems for fabricability and current density. These problems can be overcome through modifications described in the present invention.

When the layers within a Nb/Ti composite filament are very thick, it is neither practical nor effective to generate much of the requisite degree of diffusion within the filament prior to extrusion in the manner of a preferred embodiment of the invention described in the parent patents. Under the laws of solid state diffusion, the distance of diffusion at a given temperature increases with the square root of time. To diffuse twice the distance within a composite at a given temperature, one would require four times the length of time. So when the niobium and titanium layers of a filament are very thick, it can require prohibitively long periods of time to achieve the required amount of diffusion. Of course, one can increase the temperature to speed diffusion. (By the solid state diffusion laws, increasing the temperature increases the rate of diffusion in an exponential manner.) While in principle this is an effective approach to thick layers, in practice the temperature must be so high that grain growth and grain boundary diffusion occurs, especially within the titanium layers. This reduces the homogeneity and the degree of order within the structure. The consequence is a degradation of $J_c$ performance for the final conductor due to less efficient flux pinning.

As it is not desirable to optimally diffuse thick niobium and titanium layers prior to extrusion, one is left with a processing route wherein much of the diffusion heat treatment is performed after extrusion. Such a scheme entails extrusion of filaments containing essentially undiffused niobium and titanium layers (FIG. 2A). This presents problems because the Nb/Ti structure does not flow during extrusion in the same way as an optimally diffused structure. In fact, it has been found that filaments containing essentially undiffused niobium and titanium are unusually susceptible to shear fracture during extrusion. If not actually fractured, the filaments often display highly distorted layers. In either case, $J_c$ performance is greatly depressed.

For those familiar with the art, the design of the proposed SSC conductor poses significant difficulties in producing the fine filaments (6 microns) due to problems of sausaging and intermetallic formation of the filaments in the copper matrix. The same concerns exist within the present invention, thus the same care must be taken in avoiding these problems. The niobium and titanium system shall be used as the exemplar throughout this discussion. It will be understood, however, that the principles discussed could be applied to many alternate systems as discussed in the parent patents.

BRIEF DESCRIPTION OF THE INVENTION

When the present invention is applied to the NbTi superconductor system, it involves the partial diffusion of Nb and Ti layers by means of a diffusion heat treatment. This diffusion of Nb into Ti lowers the alpha to beta transformation temperature of the Ti rich layer and allows extrusion in the beta phase at a lower extrusion temperature. At some point in the reduction, when the layers are between 2.5-15 microns, a further diffusion heat treatment is given to form optimal superconducting NbTi for the best Jc at the magnetic field of interest.

One method by which to avoid the mechanical extrusion problems of the pure niobium and pure titanium composite filaments is to extrude under conditions where all beta-phase NbTi exists. Beta-phase NbTi is a body centered cubic (bcc) phase that has greater ductility than the hexagonal close packed (hcp) alpha-phase of room temperature unalloyed titanium. The Ti-Nb phase diagram of FIG. 3 shows that increasing Nb concentration (via diffusion) lowers the alpha to beta transformation temperature, thus decreasing the required extrusion temperature. As described above, higher temperatures lead to deleterious grain growth and grain boundary diffusion. Partial diffusion within the filaments prior to extrusion reduces the required extrusion temperature to transform the thick Ti layers to the beta-phase, mechanically more like a conventional NbTi alloy. Additional heat treatment after extrusion is necessary to reach optimal superconducting alloy composition and Jc values.

The diffusion heat treatment step prior to extrusion may consist of heating the monofilament prior to restack, a separate billet heating step after restack (e.g., hot isostatic pressing), billet preheating prior to extrusion, or any combination of these operations.

The time at temperature of the heat treatment prior to extrusion will depend upon the layer thickness within the filaments, being shorter for smaller layer thicknesses. It must be emphasized that the diffusion caused by this heat treatment is intended to be partial; the diffusion heat treatment applied after extrusion is where sufficient superconducting NbTi is formed to produce optimal conductor $J_c$'s. While leaving sufficient non superconducting material to serve as the APC layer.

DETAILED DESCRIPTION OF THE INVENTION

The major drawback to partial diffusion heat treatment prior to extrusion is that some grain growth and grain boundary diffusion inevitably occurs. This tends to increase grain size and decrease the homogeneity within the layers and ultimately reduce current density. Depending upon the application, the reduction in $J_c$ might be an acceptable trade-off for the improved ductility. Experience has shown, however, that it may not be necessary to heat treat the filaments or the secondary billet for substantial lengths of time, so long as the extrusion temperature is high (1500° F.–1600° F.). At high temperatures, a gross mechanical failure of the filaments is not generally observed and layer uniformity can be excellent. It is believed that this processing route is made possible by the fact that the high temperature alone can promote sufficient Beta-phase formation to allow extrusion of uniform layers. Overall ductility is further enhanced by the high temperature serving to anneal and soften the niobium and titanium.

Whichever pre-extrusion diffusion processing is selected, the post-extrusion processing remains essentially the same. A layer thickness (niobium or titanium) of 2.5–15 microns is achieved within the composite and a further heat treatment is applied. The heat treatment will typically be at a temperature of 1200° F.–1400° F. for 10–20 hours, but will vary depending upon the demands of the application. The heat treated composite is then drawn to a final diameter where the superconducting and nonsuperconducting layers are around 100nm in thickness. The non-limiting examples below describe various processing routes that fall within the scope of the invention.

EXAMPLE I

Monofilament

Figure 1:
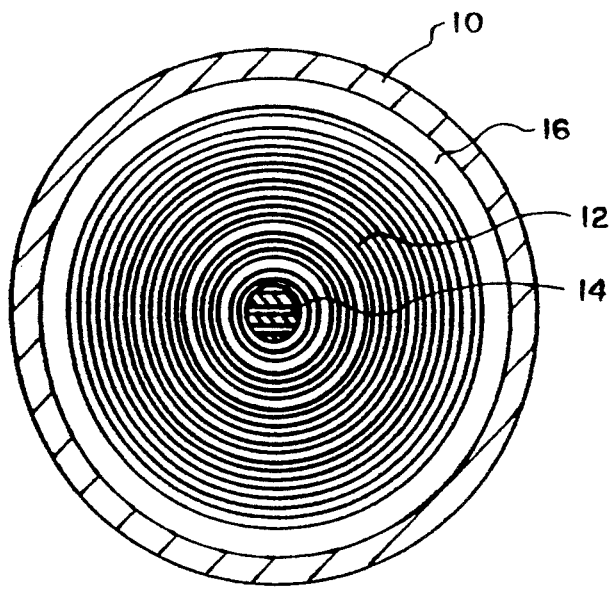
FIG. 1 is a schematic diagrammatic sectional view of one preferred type of monofilament billet.

Starting with a 6.050 inch diameter copper can 10 having a 4.880 inch diameter i.d., a 0.015 inch niobium and 0.020 inch titanium sheets 12 over a 0.875 inch diameter APC core 14. The sheets 12 are arranged in alternating sets of three so that the effective niobium thickness is 1.143 mm and the effective titanium thickness is 1.524 mm (see FIG. 1). These thicknesses are required to achieve a 100 nm Nb+Ti thickness at final wire size (0.648 mm). This requires a reduction in thickness of each layer by a factor of about 26,670. A niobium barrier 16, typically comprising six turns of 0.015 inch niobium sheets, totalling about 4% of the non-copper volume, is interposed between the outermost niobium layer and the copper can. The barrier prevents copper contamination within the filaments during subsequent processing. A core of NbTi, Nb or stacked Nb and Ti sheets are inserted into the center of the assembly. When the sheet assembly is complete, a copper nose and tail are tungsten inert gas (TIG) welded into place, the billet is evacuated at 900° F. to a pressure below $10^{-6}$ torr, and is then sealed. The billet is preheated for 5 hours at 1600° F. prior to extrusion to a diameter of 21.8 mm, a thickness reduction of 7 times. The extrusion conditions for the monofilament billet does not create significant diffusion between Nb and Ti layers due to the large relative layer thicknesses and because the layers are not in intimate contact due to the lack of a hot isostatic pressed (HIP) or cold isostatic pressed (CIP) operation.

The extruded rod is rough cropped and then drawn to 9.27 mm diameter, a thickness reduction of 2.4. At this point, it is pickled in nitric acid to a diameter appropriate for a filament spacing-to-diameter ratio (s/d) of about 0.17. After two further drawing passes aimed at smoothing the surface, the wire is given a final cropping to ensure uniform material properties. At this stage, there is limited diffusion and the thickness of each layer has been reduced by a factor of 16.5.

Multifilamentary Restack

Figure 2A:
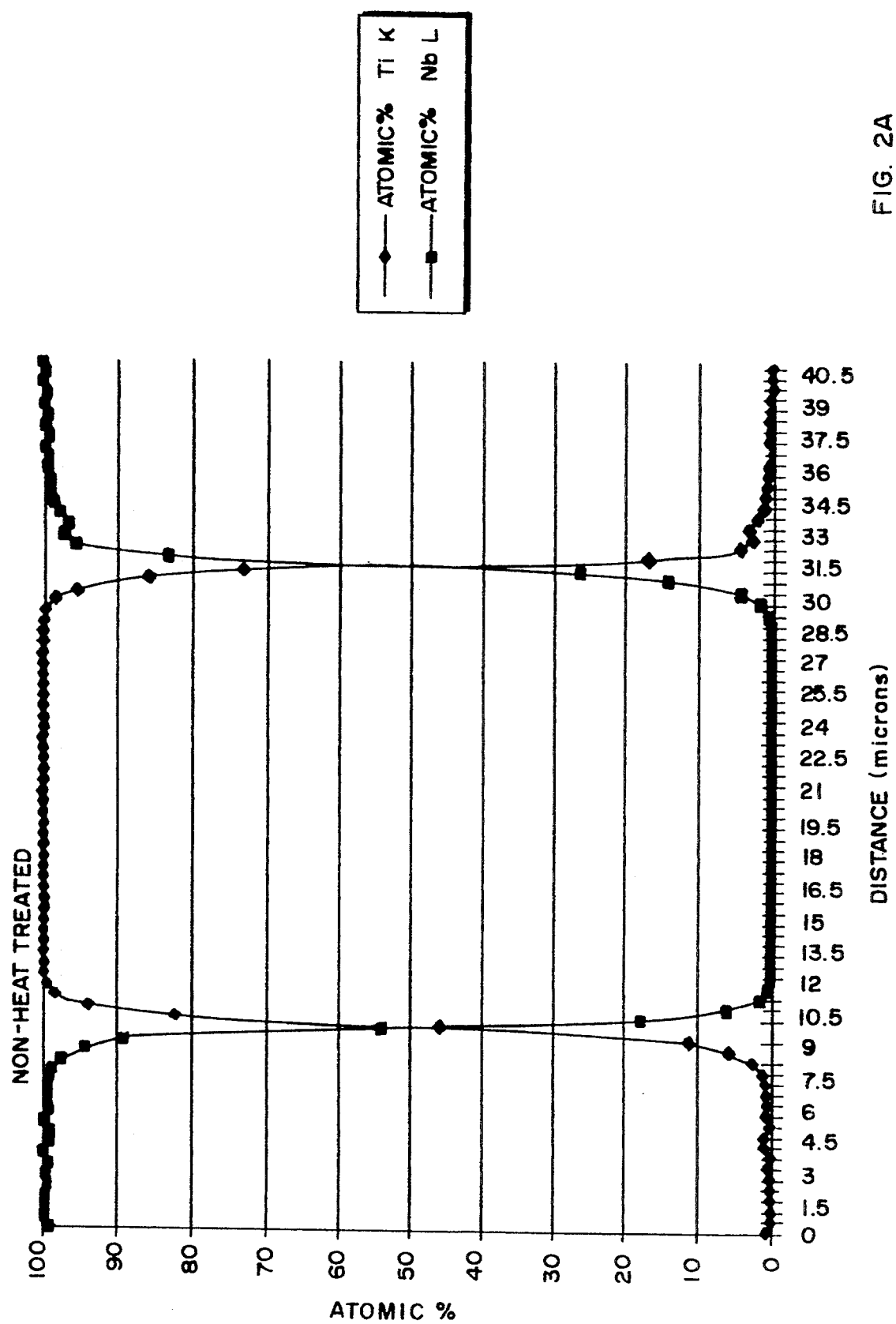
FIG. 2a, 2b, and 2c are composition scans made with a scanning electron microscope showing atomic percent of Nb and Ti as a function of scanning distance (in microns) across a section of a filament layer during various stages in the process.
Figure 2B:
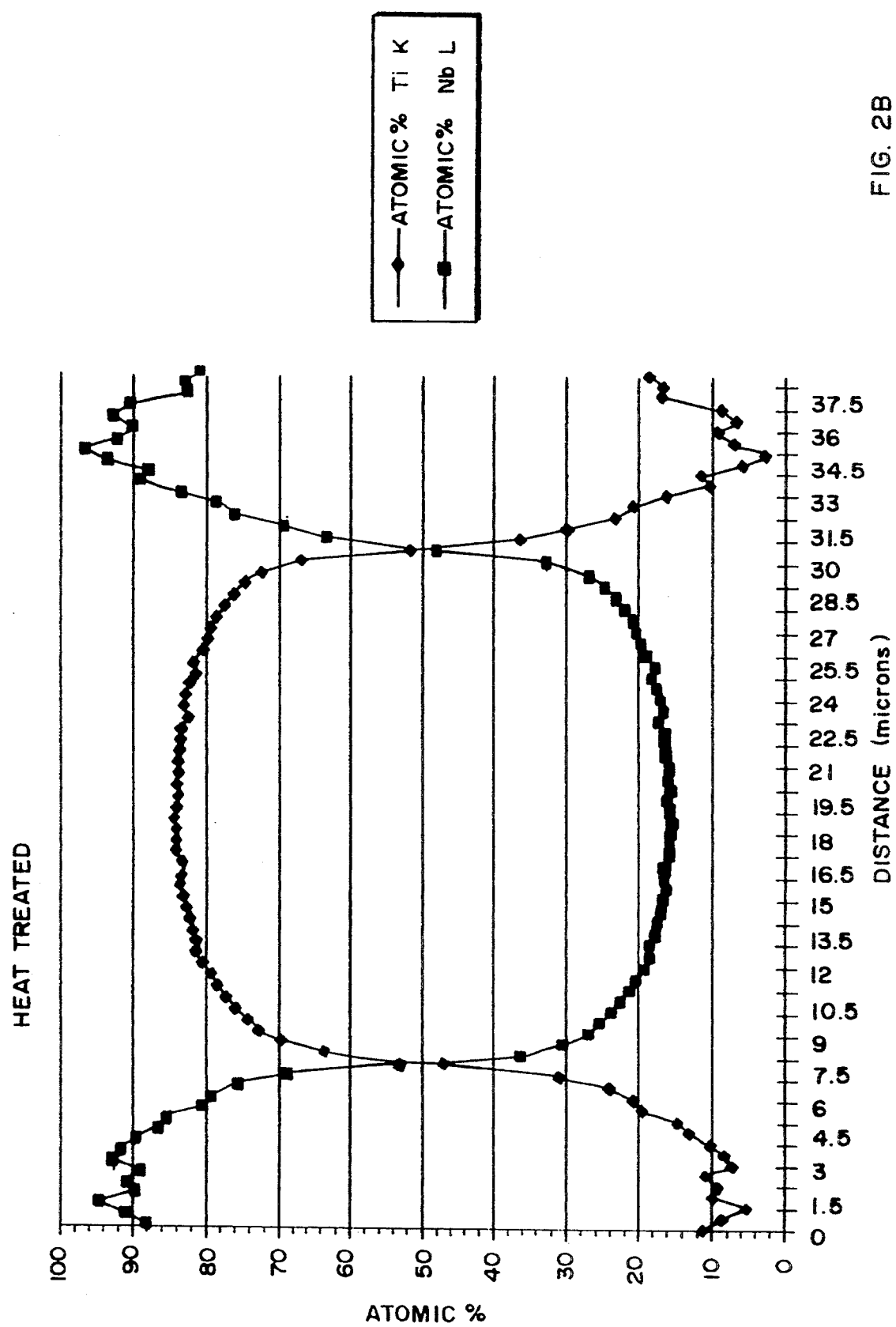
Figure 3A:
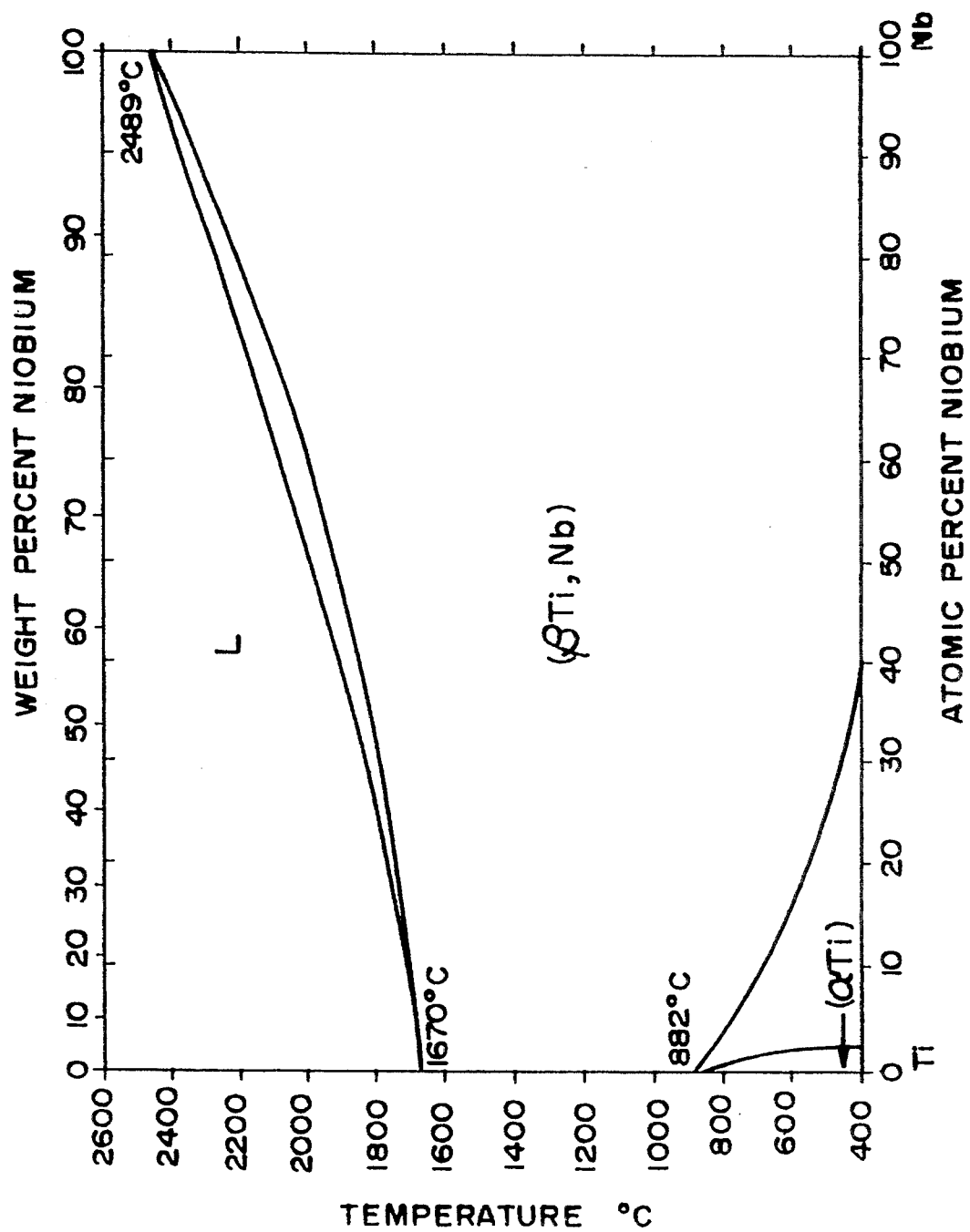
FIGS. 3a and 3b are NbTi phase diagrams.
Figure 3B:
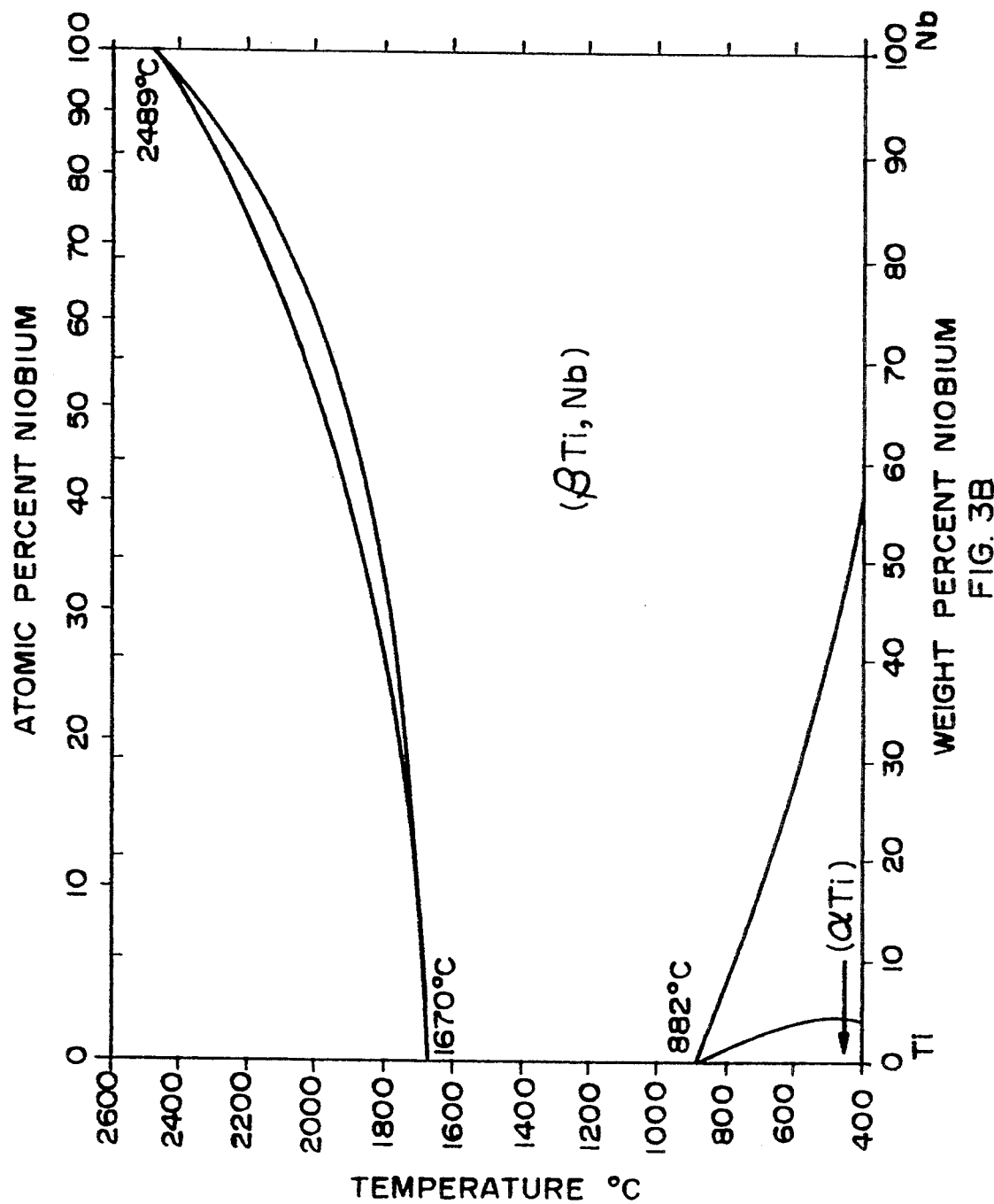

A portion of the cropped material is drawn to 1.448 mm hex diameter wire, (a further reduction of 6.4 times) where the Nb+Ti layer thickness is about 25 microns (Nb+Ti thickness×1.448 mm/153.7). The hex wire is then straightened and cut to 127mm lengths. At this point, the compositional scan (FIG. 2A) shows little diffusion of Nb into the Ti layers. 811 of these filaments are placed into a furnace for heat treatment in an argon atmosphere. The heat treatment temperature is 1600° F. and the time is 4 hours. Diffusion occurs as a result of this heat treatment. As determined by EDS compositional scan, the compositional profile changes from that shown in FIG. 2A to that shown in 2B. (The material forming the subject of these scans was processed in accordance with the present example.) This treatment is meant to anneal the monofilament and create partial diffusion so that the pure Ti is diluted by Nb. The more ductile Beta-phase NbTi will form at a lower temperature with increasing Nb content (see FIGS. 3a and 3b). This heat treatment is not meant to form the optimal superconducting alloy composition.

Figure 2C:
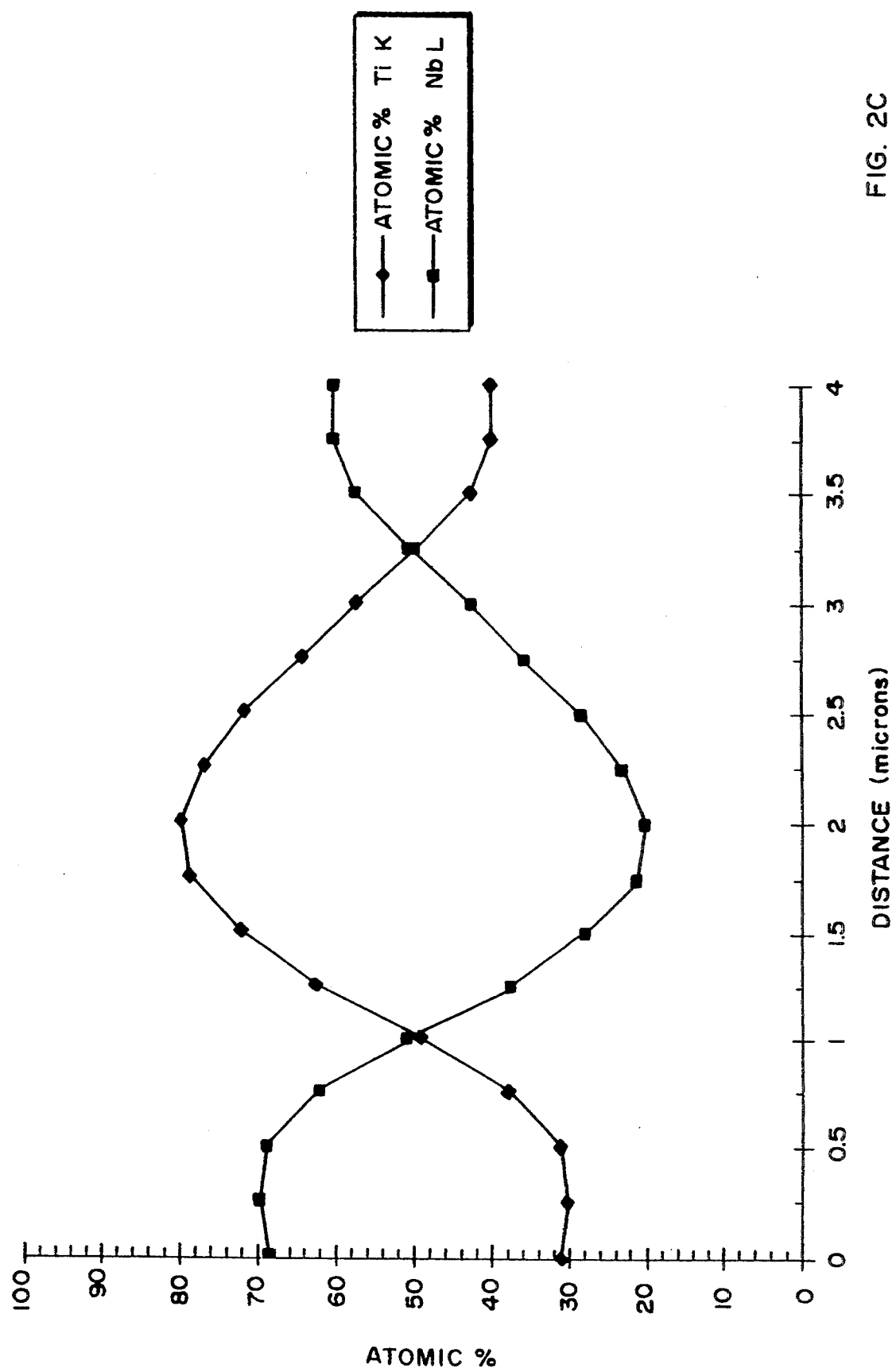

After heat treatment, the filaments are cleaned in nitric acid and 811 filaments are then stacked into a copper can having a 44.45 mm internal diameter and 50.8 mm external diameter. Copper filler rods are inserted around the stack to help minimize void space. A copper nose and tail are TIG welded into place and the billet is then evacuated and sealed. After a 2–2½ hour preheat at 1200° F., the billet is then extruded to 12.7 mm diameter (a thickness reduction of 4 times). A post extrusion diffusion heat treatment of 1200° F. for 4 hours is then applied to the extruded rod in order to form sufficient superconducting NbTi for optimal conductor $J_c$'s. At this point the compositional profile approximates that shown in FIG. 2C. After heat treatment, the rod is drawn to a final size where the superconductor and nonsuperconductor thickness is below 100 nm. At a final size of 0.208 mm diameter, it displayed a non-copper current density (at 4.2K) of 2859 A/mm$^2$ at 5 T and 1251 A/mm$^2$ at 7 T. The initial Nb and Ti layer thickness had each been reduced by a factor of 25,888 at this final stage.

While preferred examples of the invention have been described above, they are only illustrative and are not to be interpreted as limiting the scope of the invention.

EXAMPLE II

A monofilament billet is assembled and processed as described in Example I, above. However, the 1.448 hex diameter filaments are not given a heat treatment, but are directly stacked into the 50.8 mm diameter secondary billet. After evacuation and sealing, the secondary billet is heated for 2–2½ hours at 1500° F. and is then extruded to 12.7 mm diameter. The pre-extrusion heating is meant to raise the temperature of the billet to a uniform level, anneal the monofilaments, and partially diffuse the Nb and Ti. A post extrusion heat treatment is then applied in order to form sufficient superconducting NbTi for optimal conductor $J_c$. A composite processed in this manner had a post-extrusion heat treatment of 1200° F. for 8 hours. At a final size of 0.208 mm diameter, it displayed a non-copper current density at (at 4.2K) of 3061 A/mm$^2$ at 5 T and 1564 A/mm$^2$ at 7 T.

It is not necessary that the pre-extrusion heat treatment be combined with the billet heating time. For example, the billet may be heated in argon atmosphere for 2 hours at 1500° F. and then separately heated for 2–2½ hours at 1200° F. prior to extrusion. A diffusion heat treatment after extrusion is followed by drawing as described in the above Example.

EXAMPLE III

It is not always necessary to apply the diffusion heat treatment immediately after extrusion. It can be applied at an intermediate stage of the drawing process or even at several stages, provided that the layer thicknesses within the composite are large enough (2.5–15 microns) to allow controlled diffusion. The following example describes the case where an APC composite is heat treated at an intermediate wire diameter:

A monofilament billet is assembled and processed as described in Example I, except that it is hexed to a diameter of 3.302 mm. At this size, the Nb+Ti layer thickness is about 60 microns, having been reduced in thickness by a factor of 46.5. This wire is then straightened and cut to 127 mm lengths optimal conductor $J_c$'s. The filaments are etched clean in nitric acid and 127 of them are stacked in a hexagonal array inside a copper can having 44.45 mm internal diameter and a 50.8 mm external diameter. Copper filler rods are inserted around the stack to help minimize void space. A copper nose and tail are welded into place and the billet is then evacuated and sealed. After a 2–2½ hour preheat at 1500° F., the billet is extruded to 12.7 mm diameter, thickness reduction of 4 times. The extruded rod is cold drawn to 7.67 mm diameter, where the Nb+Ti layer thickness is about 9 microns. At this point, the material is diffusion heat treated and drawn to final size as described previously. A composite processed in this manner had a diffusion heat treatment of 1200° F. for 12 hours at the 7.67 mm diameter. At a final size of 0.095 mm diameter, it displayed a non-copper current density (at 4.2K) of 2917 A/mm$^2$ at 5 T and 1156 A/mm$^2$ at 7 T. The initial monofilament Nb and Ti layers had each been reduced by a factor of 28,891 in this final state.

EXAMPLE IV

Figure 4A:
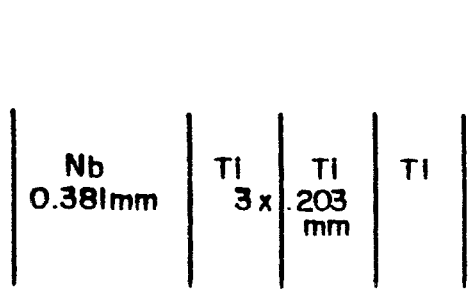
FIGS. 4a and 4b are schematic views of additional arrangements of Nb and Ti layers.
Figure 4B:
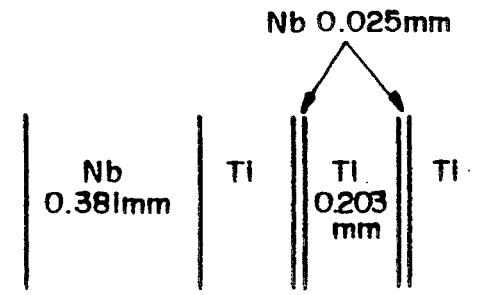

In yet another embodiment of the invention, it is possible to overcome the problem of processing thick Nb/Ti layers by increasing the ease with which the titanium layers are diluted by Nb in order to lower the alpha to beta transformation temperature. This can be accomplished by introducing niobium into the titanium layer within the Nb/Ti monofilament-i.e. by subdividing the titanium in such a way as to create a fine scale Nb/Ti structure within the larger structure such that the Nb has a shorter distance to diffuse. (Compare FIGS. 4a and 4b).

During thermal processing, the fine scale niobium quickly diffuses into the titanium, improving the overall ductility of the filament and thus the viability of extrusion. The thinner layer structure of this nature does not face the same extrusion difficulties as the thicker layers do as previously discussed. Thus, enough diffusion can occur in a pre-extrusion heat treatment in order to improve ductility and the viability of extrusion without deleterious grain growth or grain boundary diffusion. A post-extrusion heat treatment is provided to further create sufficient superconducting NbTi for optimal conductor $J_c$. Another alternative is to provide all the diffusion prior to extrusion, removing the need for the additional post extrusion heat treatment step. The overall heat treatment is significantly less then that required for thicker layer structures due to the shorter diffusion paths. For this reason, it is possible to maintain niobium layers essentially undiffused, ultimately serving to enhance flux pinning and, consequently, improve current density.

A major advantage to this fine-scale Nb/Ti approach is that high temperatures need not be employed in the processing, since the diffusion of the niobium within the titanium will be relatively rapid even at moderate temperatures. Grain growth and grain boundary diffusion is thus eliminated, ensuring layer uniformity. Another advantage is that the normal/superconductor spacing within such a material can be adjusted by adjusting the relative width of the fine-scale Nb/Ti zone. This allows improved matching to the flux line lattice spacing at a given field and, hence, improved $J_c$ at that field. A composite processed in accordance with the fine-scale Nb/Ti approach is described in the following non-limiting example.

A monofilament billet is assembled using Nb and Ti sheets. The sheets are cut and stacked to produce an approximately cylindrical assembly. The sheets are ordered so as to form a repetitive structure with the following sheet sequence: 0.301 mm thick Nb+0.203 mm Ti+0.025 mm Nb+0.203 mm Ti+0.025 mm Nb+0.203 mm Ti. Approximately 34 of these compound layers comprise the stack. The stack of sheets is surrounded by a 0.762 mm thick Nb barrier and this assembly is then inserted into a copper can having a 44.45 mm internal diameter and a 50.8 mm external diameter. Strips of copper sheet are placed around the assembly to help minimize void space. A copper nose and tail are TIG welded into place, the billet is evacuated, and then sealed. It is then heated for 2-2½ hours at 1600° F., followed by extrusion to 12.7 mm diameter. No significant diffusion occurs during the extrusion preheat due to the large layer thickness and the fact the layers are not in intimate contact due to the lack of a HIP or CIP operation.

The extruded rod is cropped and then cold drawn to 1.143 mm hex diameter, a factor of 44.4 thickness reduction, where the titanium layers are about 5 microns thick. This wire is straightened and cut to 127 mm lengths. 1,165 of these filaments are etched clean in nitric acid and then stacked into a copper can having a 44.45 mm internal diameter and a 50.8 mm external diameter. Copper filler wire is used to help fill the void space around the stack. A copper nose and tail are TIG welded into place and the billet is evacuated and sealed. The billet is preheated for 2-2½ hours at 1400° F. prior to extrusion to a diameter of 12.7 mm. The billet preheat and extrusion are sufficient to drive the thin niobium layers into solution with the titanium layers without overly involving the thicker niobium layers. The greater ductility developed in the titanium region due to the formation of a ductile NbTi alloy helps ensure adequate filament quality and layer uniformity.

The extruded rod is given a further heat treatment of 10 hours at 1200° F. to form sufficient superconducting NbTi for optimal conductor $J_c$. The rod is then drawn to a final size of 0.232 mm, where optimum flux pinning and current density is observed. The Nb+Ti layer thickness had each been reduced by a factor of 9732 in this final stage.

Although the above examples describe a NbTi system the same concepts may be applied to alternative superconducting systems. For example, the ideas embodied in examples I, II and III may be applied to the NbTiTa ternary system by replacing the Nb within the monofilament with a NbTa alloy with the rest of the processing remaining essentially unchanged. Alternatively, the NbTa alloy could be replaced in the monofilament with thin layers of Ta adjacent to the Nb layer (as described in parent U.S. Pat. No. 5,160,550) such that the diffusion time and temperature completely diffuse the Ta into the Nb and Ti regions. The concepts of example 4 could be utilized in such a manner by placing a 0.025 mm Ta sheet adjacent to the 0.025 mm Nb sheets within the monofilament.

While preferred examples of the invention have been described above they are only illustrative and are not to be interpreted as limiting the scope of the invention.

We claim:

1. A method for producing a superconductor, which is optimally superconducting at a high field on the order of 5-9 T, comprising the steps of combining a plurality of metal bodies to form a composite structure, said metal bodies being selected from the groups consisting of the transition metals niobium, tantalum, titanium, zirconium and vanadium, alternate bodies being formed of different transition metals to form pairs, reacting the transition metals to cause diffusion of at least one metal into the other metal to form a ductile alloy as a result of this diffusion, limiting the extent of the reaction to less than the amount necessary to produce an optimal superconducting alloy in said pair of transition metals mechanically reducing the composite structure and providing further diffusion to produce in each said pair an optimal superconducting layer in contact with a layer which is non superconducting at said high field, each said layer being less than 1000 Angstroms thick; the diffusion process being conducted in multiple steps interspersed with mechanical reduction steps, each diffusion step being limited in time and temperature to avoid unwanted grain growth and grain boundary diffusion in each transition metal zone.

2. A method for producing a superconductor comprising the steps of combining a plurality of metal layers to form a composite structure, said metal layers being selected from the group consisting of the transition metals niobium, tantalum, titanium, zirconium and vanadium, and alloys thereof alternate layers being formed of different transition metals to form pairs, reacting the transition metals to cause diffusion of at least one metal into the other metal to form a ductile alloy as a result of this diffusion, limiting the extent of the reaction so as to maintain some undiffused transition metal along with the ductile alloy in at least one of each said pair of transition metals mechanically reducing the composite structure and providing further diffusion to produce a superconducting layer in contact with a non superconducting layer in each said pair, each said layer being less than 1000 Angstroms thick; the improvement wherein the thickness of each initial metal layer being reduced by a factor of at least 1000 and the diffusion process being conducted in multiple steps interspersed with mechanical reduction steps, each diffusion step being limited in time and temperature to avoid unwanted grain growth and grain boundary diffusion in each transition metal zone.

3. A method for producing a superconductor comprising the steps of combining a plurality of niobium and titanium layers to form a composite structure, alternate layers being formed of niobium and titanium to cause diffusion of at least one transition metal into the other metal to form a ductile NbTi alloy as a result of this diffusion, mechanically reducing the composite structure and providing further diffusion to produce an optimal superconducting NbTi layer in contact with a non superconducting layer in each said pair, each said layer being less than 1000 Angstroms thick; the thickness of each initial metal layer being reduced by a factor of at least $10^3$ and the diffusion process being conducted in multiple steps interspersed with mechanical reduction steps, each diffusion step being limited in time and temperature to avoid unwanted grain growth and grain boundary diffusion in each transition metal zone.

4. Method for producing a superconductor which is superconducting at a high field and low temperature comprising the steps of combining a plurality of metal layers to form a composite structure, said metal layers being selected from the group consisting of the transition metals niobium, tantalum, titanium, zirconium and vanadium, and alloys of such metals, alternate layers or groups of layers being formed into an assembly having different transition metal layers, reacting the transition metals to cause diffusion of at least one metal into the other metal to form a ductile alloy as a result of this diffusion, limiting the extent of the reaction so as to maintain zones of transition metal and transition metal alloys which are not superconducting at said high field along with the ductile alloy, mechanically reducing the composite structure and providing further diffusion to produce a final layer which is superconducting at said field, said superconducting layer being in contact with a final non superconducting layer in each said assembly, each said final layer being less than 1000 Angstroms thick; the diffusion process being conducted in multiple steps interspersed with mechanical reduction steps, each diffusion step being limited in time and temperature to avoid unwanted grain growth and grain boundary diffusion in each transition metal zone.

5. The method of claim 4 wherein said superconducting layer comprises a ternary alloy.

* * * * *